(12) United States Patent
Jou et al.

(10) Patent No.: US 8,216,634 B2
(45) Date of Patent: Jul. 10, 2012

(54) HIGH-MOLECULE-BASED ORGANIC LIGHT-EMITTING DIODE AND FABRICATION METHOD THEREOF

(75) Inventors: Jwo-Huei Jou, Hsin-Chu (TW);
Wei-Ben Wang, Hsin-Chu (TW);
Mao-Feng Hsu, Hsin-Chu (TW);
Chun-Jang Wang, Hsin-Chu (TW);
Yu-Chiao Chung, Hsin-Chu (TW)

(73) Assignee: National Tsing Hua University, Hsin-Chu (TW)

( * ) Notice: Subject to any disclaimer, the term of this patent is extended or adjusted under 35 U.S.C. 154(b) by 111 days.

(21) Appl. No.: 12/462,608

(22) Filed: Aug. 6, 2009

(65) Prior Publication Data

US 2011/0031875 A1 Feb. 10, 2011

(51) Int. Cl.
*B05D 5/06* (2006.01)
*B41M 5/00* (2006.01)
*H01J 1/62* (2006.01)
*H01J 63/04* (2006.01)
*C09K 11/06* (2006.01)

(52) U.S. Cl. ......... 427/64; 313/504; 428/195.1; 427/67; 252/301.16

(58) Field of Classification Search .............. 427/67
See application file for complete search history.

(56) References Cited

U.S. PATENT DOCUMENTS

| 2004/0170861 A1* | 9/2004 | Culligan et al. .............. 428/690 |
| 2006/0234059 A1* | 10/2006 | Cella et al. ................. 428/411.1 |
| 2007/0173657 A1* | 7/2007 | Chen et al. .................... 556/413 |
| 2009/0066234 A1* | 3/2009 | Chae et al. .................... 313/504 |
| 2009/0179552 A1* | 7/2009 | Froehlich et al. ............ 313/504 |

OTHER PUBLICATIONS

Jou et al. "A New Door for Molecular-Based Organic Light-Emitting Diodes" (2008).*
Jou, et al., A new door for molecular-based organic light-emitting diodes, Proc. SPIE, vol. 7051, 70510P, 2008, online publication, Sep. 2, 2008.

* cited by examiner

*Primary Examiner* — James Lin
*Assistant Examiner* — Austin Murata
(74) *Attorney, Agent, or Firm* — Hudak, Shunk & Farine, Co. LPA

(57) ABSTRACT

The present invention discloses a high-molecule-based organic light-emitting diode (OLED) and a fabrication method thereof. The high-molecule-based OLED comprises a layer selected from a group consisting of an organic emissive layer, a first emission-auxiliary layer and a second emission-auxiliary layer. The organic emissive layer, first emission-auxiliary layer or second emission-auxiliary layer comprises a molecular material having a molecular weight of larger than approximately 730 g mol$^{-1}$, and is formed by a solution-process.

8 Claims, 7 Drawing Sheets

HIGH-MOLECULE-BASED ORGANIC LIGHT-EMITTING DIODE AND FABRICATION METHOD THEREOF

BACKGROUND OF THE INVENTION

1. Field of the Invention

The present invention relates to a field of an organic light-emitting diode and a fabrication method thereof. More specifically, the present invention relates to a high-molecule-based organic light-emitting diode and a fabrication method thereof.

2. Description of Related Art

Organic light-emitting diodes (OLEDs) are increasingly attracting interest because of their great potential as high-quality flat-panel displays and for liquid-crystal-display backlighting and solid state illumination applications. To replace current display and illumination technologies, and to make the resultant products more energy-saving and last longer, OLEDs with higher power efficiency are demanded. A high efficiency device must possess properties of low carrier-injection-barrier, high carrier mobility, excellent carrier- and exciton-confinement, effective exciton-generation on host, efficient host-guest energy-transfer, balanced carrier-injection and high self-luminescent materials. The use of phosphorescent materials is an important strategy to obtain high-efficiency OLEDs, because they allow for the simultaneous harvesting of both singlet and triplet excitons, achieving nearly 100% internal quantum efficiency. Moreover, the phosphorescent materials must be morphologically stable during fabrication and operation. This fact, on the other hand, has revealed one drawback frequently encountered when employing hosts with low molecular weight that the resultant film integrity may be easily damaged owing to the inherently low glass-transition temperature. As a result, the ideal host molecules, if not polymeric, should be ones with high molecular weight, such as a host molecule, 3,5-di(9H-carbazol-9-yl)tetraphenylsilane, recorded in US Patent No. 2007/0173657.

Furthermore, long lifetime molecular-based organic electronics, such as OLEDs, organic solar cells, organic transistors, organic sensors, organic memories and etc, inevitably demand their constituent molecules to be highly thermal-stable. Polymer materials exhibit varied molecular-weight and are not easy to be purified, causing the resultant devices to commonly exhibit a lower efficiency. In contrary, small molecular materials possess high electroluminescent efficiency but their low molecular weights would cause weak mechanical strength of the film integrity. Coupling with the special needs in molecular design, this will inevitably result in an increase in molecular weight.

However, the increased molecular weight would in turn make the resultant molecules difficult to deposit by using a vacuum evaporation method, while using a solution-process would frequently result in undesired relatively poorer efficiency. As a result, it is necessary to provide an OLED capable of having molecular materials and high efficiency.

SUMMARY OF THE INVENTION

The present invention provides a high-molecule-based organic light-emitting diode (OLED) and a fabrication method thereof, in which such a high-molecule-based OLED will be highly efficient and thermally stable.

A primary aspect of the present invention is to provide a high-molecule-based OLED. The high-molecule-based OLED comprises an organic emissive layer comprising a host or guest molecular material. The high-molecule-based OLED is characterized by that the host or guest molecule material having a molecular weight of larger than approximately 730 g mol$^{-1}$, and the organic emission layer formed by a solution-process. The molecular weight of the host or guest molecule material is preferable approximately 730 g mol$^{-1}$-10000 g mol$^{-1}$. The host and guest molecular material may further comprise a high glass transition temperature and a high decomposition temperature, respectively. Moreover, the high-molecule-based OLED may further comprise an auxiliary layer selected from a group consisting of a first emission-auxiliary layer and a second emission-auxiliary layer. The first emission-auxiliary layer may be a hole transporting layer and/or a hole injecting layer. The second emission-auxiliary layer may be an electron transporting layer and/or an electron injecting layer. The auxiliary layer may comprise a molecular material having a molecular weight of larger than approximately 730 g mol$^{-1}$, and the auxiliary layer is deposited by the solution-process. The molecular weight of the molecule material is preferable approximately 730 g mol$^{-1}$-10000 g mol$^{-1}$.

Another aspect of the present invention is to provide a method for fabricating a high-molecule-based OLED, the high-molecule-based OLED comprises an organic emissive layer, and the organic emissive layer comprises a host or guest molecular material. The method is characterized by comprising a step of using the host or guest molecule material having a molecular weight of larger than approximately 730 g mol$^{-1}$, and depositing the organic emissive layer by a solution-process. The host molecular material may comprise 3,5-di(9H-carbazol-9-yl)tetraphenylsilane (SimCP2). The guest molecular material may comprise bis[5-methyl-7-trifluoromethyl-5H-benzo(c)(1,5)naphthyridin-6-one]iridium(picolinate) (CF$_3$BNO). Additionally, the high-molecule-based OLED may further comprise a first emission-auxiliary layer or a second emission-auxiliary layer, in which the first or second emission-auxiliary layer may comprise a molecular material having a molecular weight of larger than approximately 730 g mol$^{-1}$ and is formed by the solution-process. Wherein, the solution-process may be a spin-coating, screen-printing, inkjet-printing, contact-printing, dip-coating and etc.

According to yet another aspect of the present invention, a high-molecule-based OLED is provided. The high-molecule-based OLED comprises an auxiliary layer selected from a group consisting of a first emission-auxiliary layer and a second emission-auxiliary layer, and is characterized by that the auxiliary layer comprising a molecular material having a molecular weight of larger than approximately 730 g mol$^{-1}$ and being formed by a solution-process. The high-molecule-based OLED comprises an organic emissive layer, and the organic emissive layer may be sandwiched between the first emission-auxiliary layer and the second emission-auxiliary layer.

According to still another aspect of the present invention, a method for fabricating a high-molecule-based OLED is provided. The high-molecule-based OLED comprises an auxiliary layer selected from a group consisting of a first emission-auxiliary layer and a second emission-auxiliary layer, characterized by that the auxiliary layer comprising a molecular material having a molecular weight of larger than approximately 730 g mol$^{-1}$, and the auxiliary layer formed by a solution-process.

In brief, the high-molecule-based OLED and the fabrication method thereof in accordance with the present invention provide one or more of the following advantages:

(1) While the comparatively high molecular weight would make the employed molecules extremely difficult to deposit by a vacuum evaporation, and result in poor device performance, the present invention has proven that a solution-process is quite effective and convenient as usual to the fabrication of highly-efficient OLEDs composing high molecular weight molecular components.

(2) The successful demonstration of the present invention may be extended as well to other organic devices that have composed or should compose high molecular weight molecules.

(3) The finding of the new door for molecular-based organic electronics according to the present invention to be highly efficient and thermally stable by a solution-process may also provide a new opportunity to re-investigate numerous previously reported organic materials, especially of high molecular weight, that were fabricated by a dry-process and showed performance poorer than expected.

Other aspects of the present invention will be illustrated partially in the subsequent detailed descriptions, conveniently considered partially through the teachings thereof, or comprehended by means of the disclosed embodiments of the present invention. Various aspects of the present invention can be understood and accomplished by using the components and combinations specifically pointed out in the following claims. It is noted that the aforementioned summary and the following detailed descriptions of the present invention are exemplary and illustrative, rather than being used to limit the scope of the present invention thereto.

BRIEF DESCRIPTION OF THE DRAWINGS

The exemplary embodiments of the present invention will be understood more fully from the detailed description given below and from the accompanying drawings of various embodiments of the invention.

DETAILED DESCRIPTION OF THE PREFERRED EMBODIMENTS

Exemplary embodiments of the present invention are described herein in the context of a high-molecule-based organic light-emitting diode (OLED) and a method for fabricating a high-molecule-based OLED.

Figure 1:
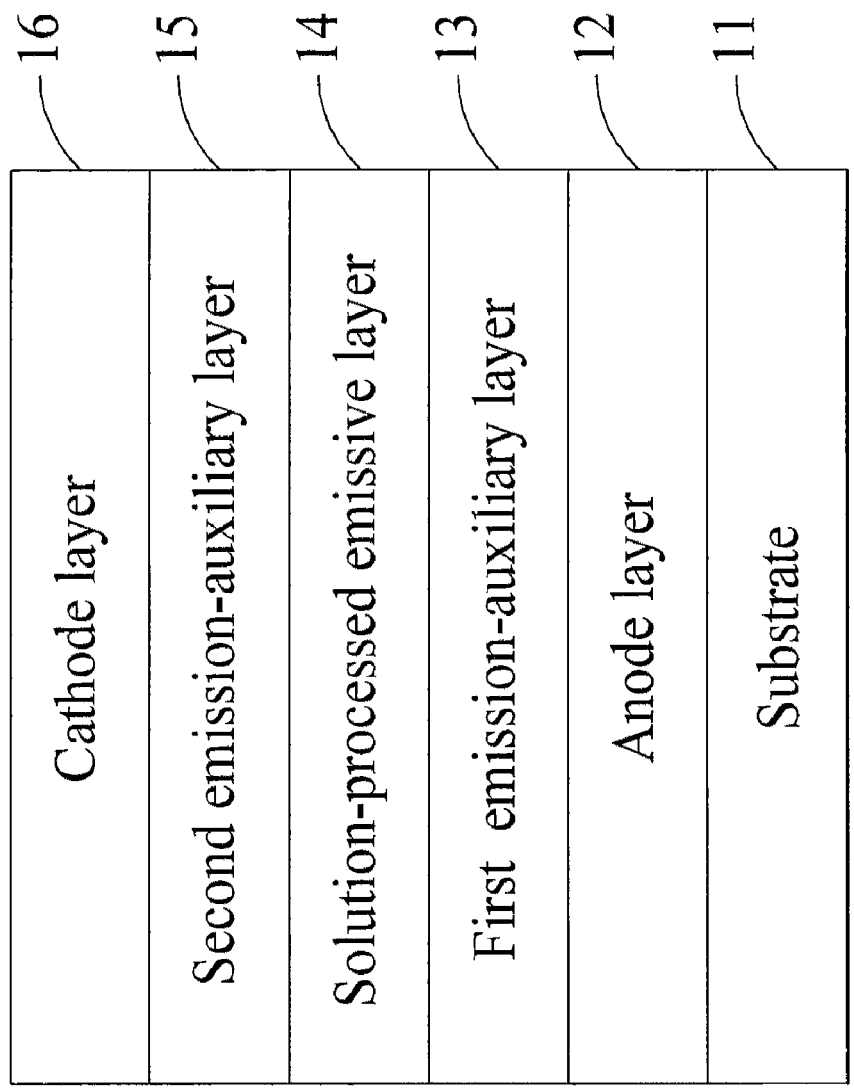
FIG. 1 illustrates a schematic diagram of a high-molecule-based OLED in accordance with an embodiment of the present invention.

Please refer to FIG. 1 for a schematic diagram of a high-molecule-based OLED in accordance with an embodiment of the present invention. The high-molecule-based OLED 1 may comprise a substrate 11, anode layer 12, first emission-auxiliary layer 13, emissive layer 14, second emission-auxiliary layer 15, and cathode layer 16. The first emission-auxiliary layer 13, organic emissive layer 14, or second emission-auxiliary layer 15 may comprise a molecular material having a molecular weight of larger than approximately 730 g mol$^{-1}$, and be formed by a solution-process. Moreover, the substrate 11 may be a glass substrate. The anode layer 12 may be composed of a metal oxide material, such as indium tin oxide (ITO), indium zinc oxide (IZO), etc. The first emission-auxiliary layer 13 may be a hole transporting layer, such as poly(3,4-ethylene-dioxythiophene)-poly-(styrenesulfonate) (PEDOT:PSS), and/or a hole injecting layer. The emissive layer 14 may comprise a phosphorescent metal complex selected from a group consisting of bis(3,5-difluoro-2-(2-pyridyl)-phenyl-(2-carboxypyridyl)iridium (III) (FIrpic), bis (4',6'-difluorophenylpyridinato)iridium(III) tetra(1-pyrazolyl)borate (FIr6), Ir(dfppy)(fppz)$_2$, Iridium(III) bis(4,6-difluorophenylpyridinato)-5-(pyridine-2-yl)-1H-tetrazolate (FIrN4), Iridium(III) bis(4,6-difluorophenylpryidinato)-3-(trifluoromethyl)-5-(pyridine-2-yl)-1,2,4-triazolate (FIrtaz), bis[5-methyl-7-trifluoromethyl-5H-benzo(c)(1,5)naphthyridin-6-one]iridium(picolinate) (CF$_3$BNO), bis[5-methyl-5H-benzo[c][1,5]naphthyridin-6-one]iridium(picolinate) (BNO), and tris(2-phenylpyridine)iridium (III) (Ir(ppy)$_3$). The second emission-auxiliary layer 15 may be an electron transporting layer, such as 1,3,5-tris(N-phenylbenzimidazol-2-yl)benzene (TPBi), and/or an electron injecting layer, such as lithium fluoride (LiF) or cesium fluoride (CsF). The cathode layer 16 may be composed of a metal material, such as aluminum (Al).

Figure 2:
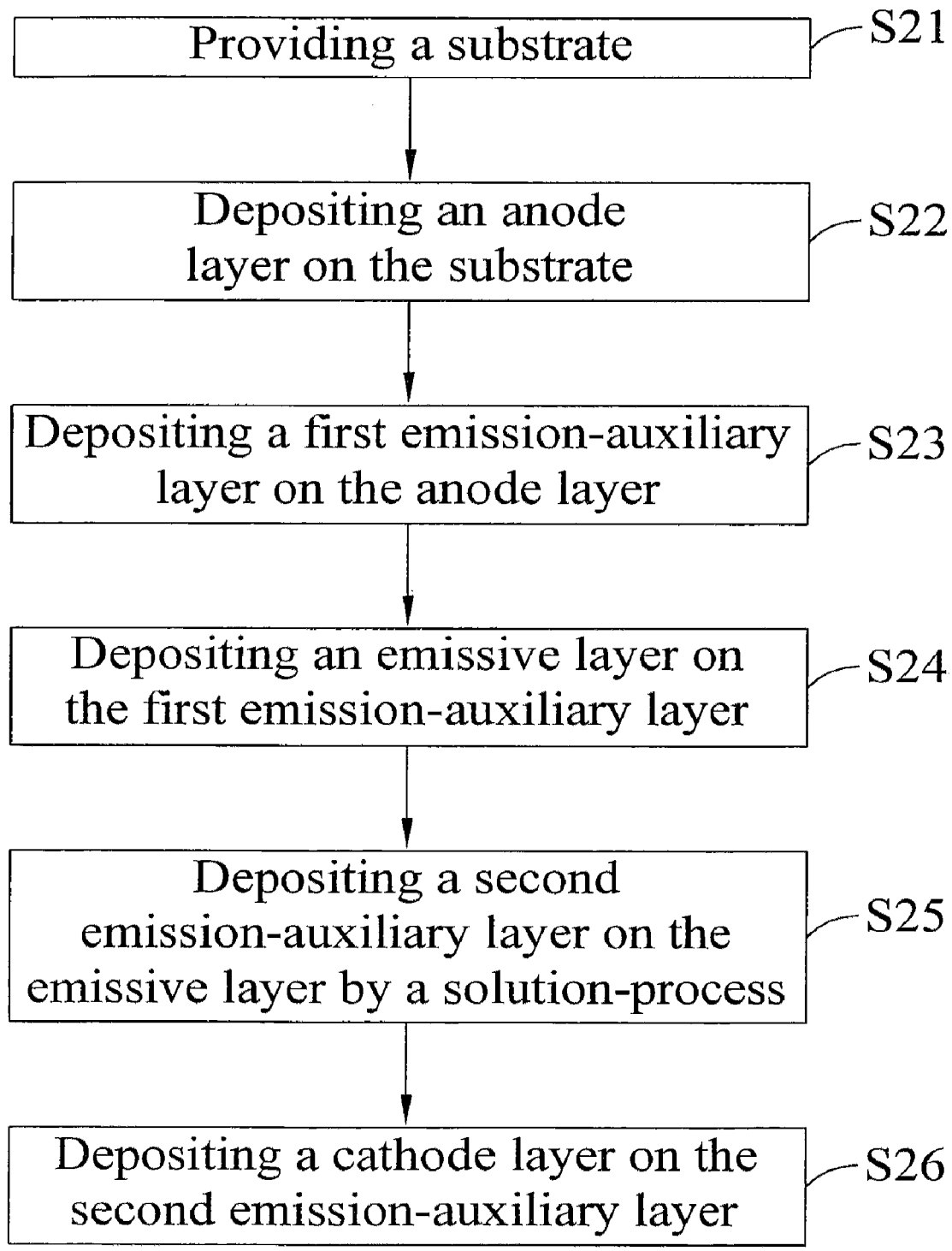
FIG. 2 illustrates a flowchart of a method for fabricating a high-molecule-based OLED in accordance with an embodiment of the present invention.

Please refer to FIG. 2 for a flowchart of a method for fabricating a high-molecule-based OLED in accordance with an embodiment of the present invention. The fabrication method comprises the steps of: S21: providing a substrate; S22: depositing an anode layer on the substrate; S23: depositing a first emission-auxiliary layer on the anode layer; S24: depositing an emissive layer on the first emission-auxiliary layer; S25: depositing a second emission-auxiliary layer on the emissive layer by a solution-process, wherein the second emission-auxiliary layer comprises a molecular material having a molecular weight of larger than approximately 730 g mol$^{-1}$; and S26: depositing a cathode layer on the second emission-auxiliary layer.

Figure 3:
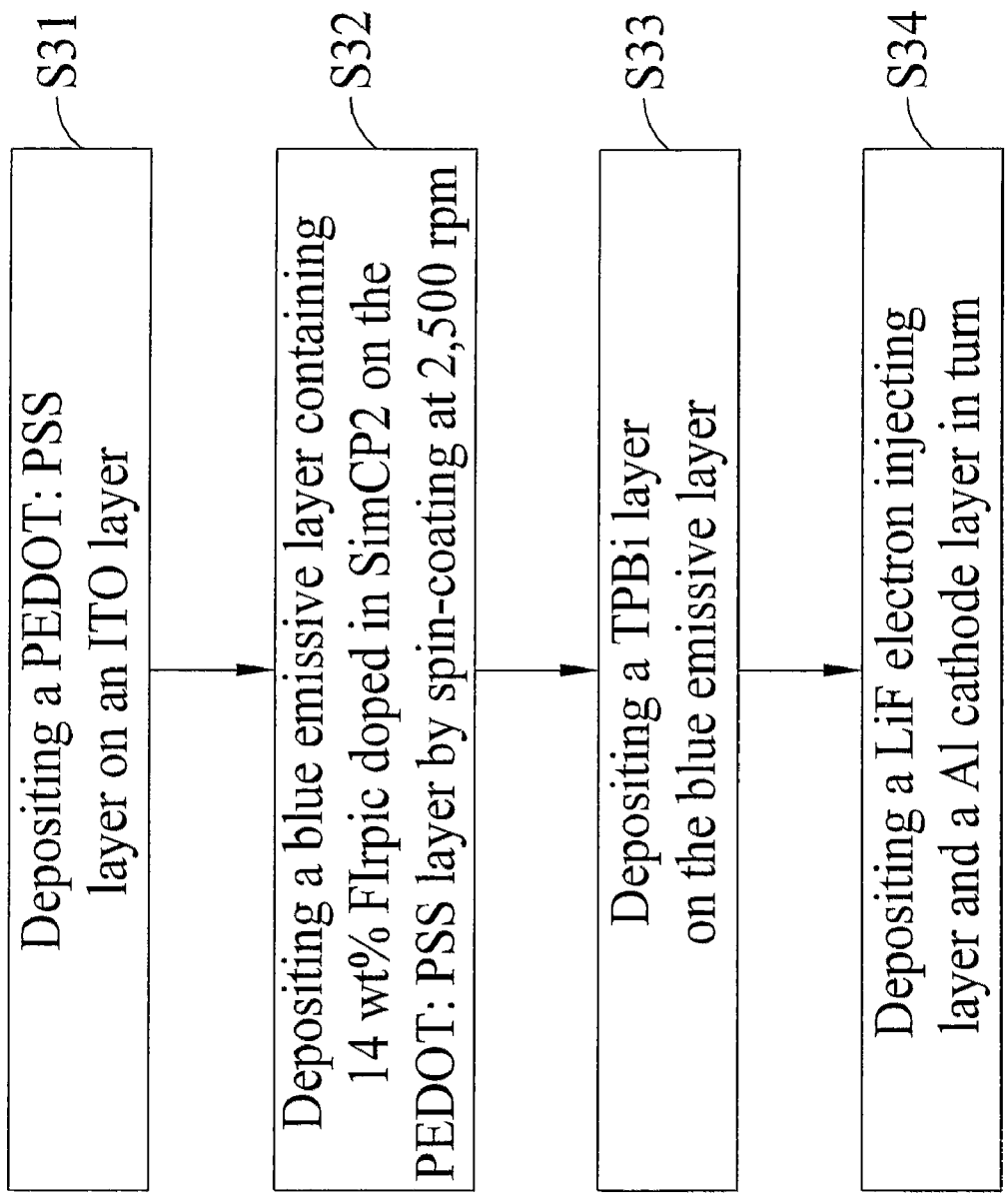
FIG. 3 is a diagram illustrating a flowchart of a method for fabricating a high-molecule-based OLED in accordance with one embodiment of the present invention.

Please refer to FIG. 3 for a flowchart of a method for fabricating a high-molecule-based OLED in accordance with one embodiment of the present invention. The fabrication method may comprise the following steps. S31: Firstly, a PEDOT:PSS hole transporting layer is disposed on a pre-cleaned ITO anode layer by spin-coating at 4000 rpm. S32: The second step was to deposit a blue emissive layer by using a solution-process. Herein, a solution that contains 14 wt % FIrpic doped in 3,5-di(9H-carbazol-9-yl)tetraphenylsilane (SimCP2) is prepared by dissolving the corresponding guest and host molecules in toluene at 45° C. with stirring. The employed well-mixed solution is then spin-coated at 2,500 rpm under nitrogen. The resultant coated layers were subsequently heated at 70° C. for half hour to remove the residual solvent. S33: Next, a TPBi electron transporting layer is deposited on the blue emissive layer. S34: Finally, a LiF electron injecting layer and a Al cathode layer are deposited in turn.

Figure 4:
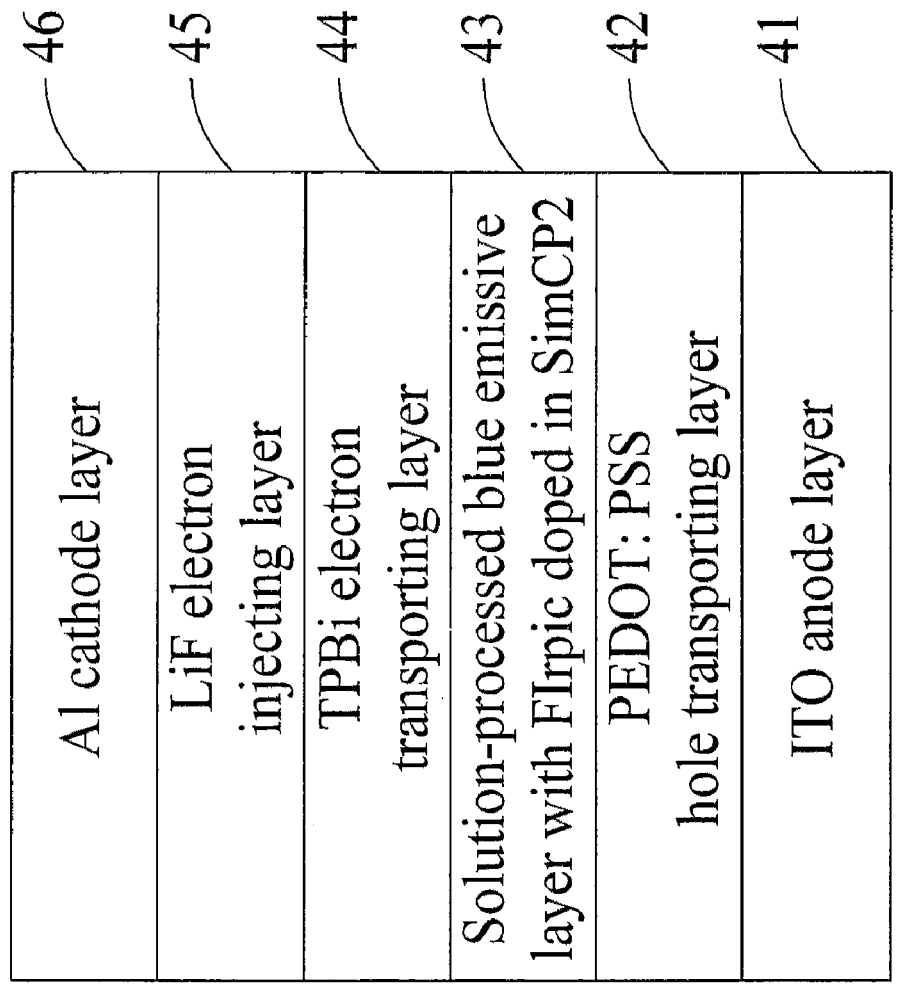
FIG. 4 is a schematic diagram of a high-molecule-based OLED fabricated by the method shown in the FIG. 3 in accordance with the present invention.

Please refer to FIG. 4 for a schematic diagram of a high-molecule-based OLED fabricated by the method shown in the FIG. 3 in accordance with the present invention. The high-molecule-based OLED 4 may be composed of a 125 nm ITO anode layer 41, a 35 nm PEDOT:PSS hole transporting layer 42, a 35 nm solution-processed blue emissive layer 43 of 14 wt % FIrpic doped in SimCP2, a 28 nm TPBi electron transporting layer 44, a 0.7 nm LiF electron injecting layer 45, and a 150 nm Al cathode layer 46.

Besides, the present invention further fabricates other various OLEDs as comparative examples by way of the similar method in the FIG. 3. Characteristics and power efficiency of the SimCP2-composing OLED, comparing with those of 3,5-bis(9-car-bazolyl)tetraphenylsilane (SimCP)- and N,N'-di-carbazolyl-3,5-benzene (mCP)-composing counterparts are shown in Table 1. Herein, the corresponding luminance is 100 cd m$^{-2}$ for the data of power efficiency shown here. The corresponding doping concentration of FIrpic for achieving the highest power-efficiency for the SimCP2-composing OLED is 14 wt % if fabricated by a solution-process. For comparison, the doping concentrations of FIrpic for the other two OLEDs by the solution-process are fixed at 14 wt %. The corresponding doping concentrations of FIrpic for achieving the highest power-efficiency were 7 wt % for all the three devices fabricated by a dry-process (vacuum-evaporation) at $1\times10^{-5}$ torr.

TABLE 1

| Host | Molecular Weight (g mol$^{-1}$) | Tg (° C.) | Process | Power Efficiency (lm/W) |
| --- | --- | --- | --- | --- |
| SimCP2 | 997 | 144 | Solution | 24.2 |
|  |  |  | Dry | 1.7 |
| SimCP | 666 | 101 | Solution | 10.4 |
|  |  |  | Dry | 10.8 |
| mCP | 406 | 55 | Solution | 5.9 |
|  |  |  | Dry | 7.3 |

Figure 5:
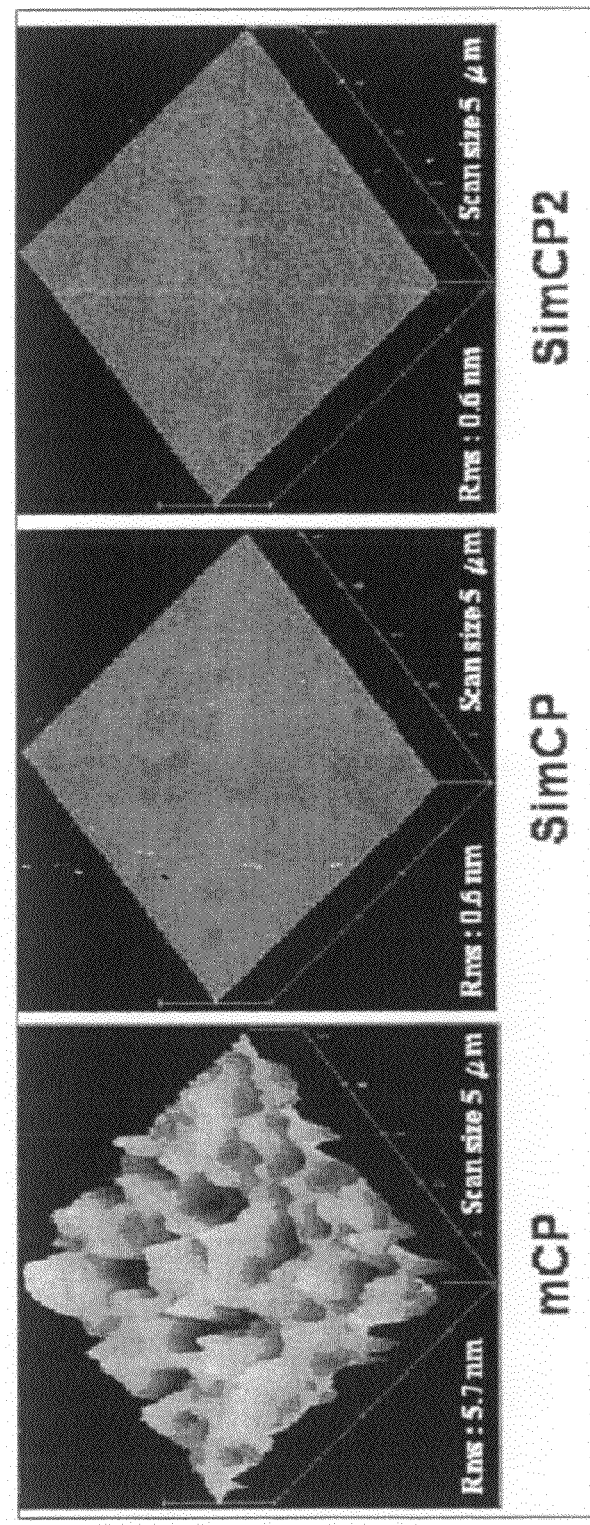
FIG. 5 illustrates AFM images of the surface topology of the three host materials, SimCP2, SimCP and mCP as prepared on substrate by a solution process in accordance with the present invention.

As seen in the table 1, the resultant power-efficiency of the blue OLEDs fabricated by a solution-process are very different from that of the ones fabricated by a dry-process. For the mCP-composing OLEDs, the dry-processed device shows a higher efficiency (7.3 lm W$^{-1}$) than the solution-processed counterpart (5.9 lm W$^{-1}$), which is in accordance with those observed in most small molecule-based OLED devices. That is the solution-processed OLEDs typically show lower efficiency than the dry-processed counterparts. One plausible reason for that is the inherently low glass-transition temperature (Tg) of small molecules (i.e. low molecular weight), making their resulting films easy to deform upon drying at elevated temperatures after the solution-process, such as spin-coating. For the SimCP-composing devices, the resultant power-efficiency is nearly the same for those by dry- and solution-processes; it was 10.8 lm W$^{-1}$ for the dry-processed device, while 10.4 lm W$^{-1}$ for the solution-processed one. As shown in FIG. 5 for atomic-force microscopic (AFM) images of the surface topology of the three different host materials as prepared on substrate by the solution-process, the surfaces of the SimCP2 and SimCP films are relatively smooth, with surface roughness of 0.6 nm, while the surface of the mCP film is rough, with surface roughness of 5.7 nm. As noted, the applied temperature is 70□ in the drying process after the films are spin-coated. The high Tg possessed by SimCP, which is 101□, would keep its film integrity intact during the drying process. In contrast, the Tg of mCP is 55□, which is much lower than the applied drying-temperature, making the resultant film easy to deform.

However, the efficiency exhibited by the dry-processed SimCP2-composing device is far too low, even lower than that of the dry-processed SimCP counterpart. This very poor efficiency performance is attributed to its relatively high molecular weight, which is 997 g mol$^{-1}$. Whilst, the molecular weight is 666 g mol$^{-1}$ for SimCP and 406 g mol$^{-1}$ for mCP. The relatively high molecular weight would make SimCP2 very difficult to vacuum-evaporate. As also indicated in a preliminary nuclear magnetic resonance characterization, the SimCP2 molecules seem to decompose upon vacuum-evaporation (not shown). This may explain why the dry-processed SimCP2-composing device exhibited a very low power-efficiency.

Figure 6:
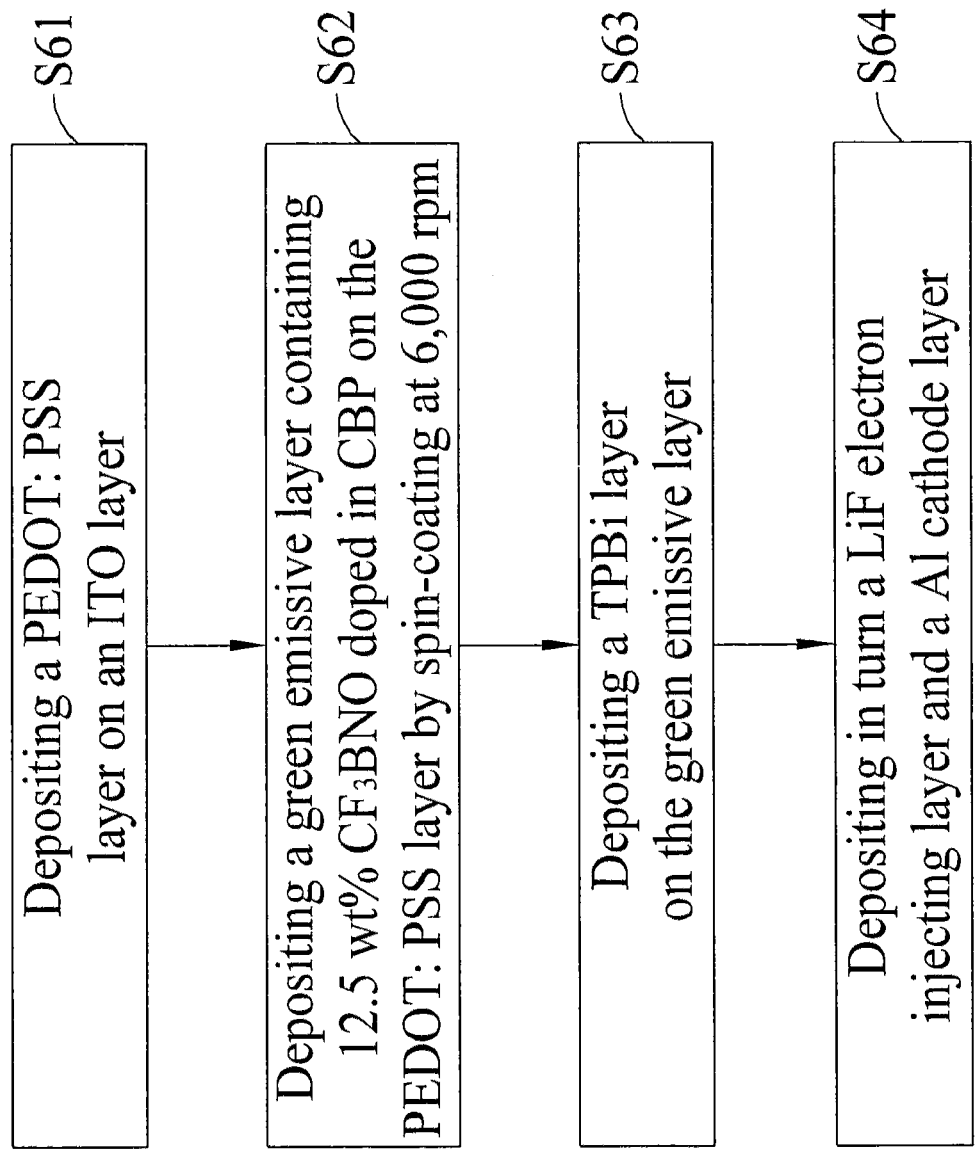
FIG. 6 illustrates a flowchart of a method for fabricating a high-molecule-based OLED in accordance with one embodiment of the present invention.

Please refer to FIG. 6 for a flowchart of a method for fabricating a high-molecule-based OLED in accordance with one embodiment of the present invention. The fabrication method may comprise the following steps. The first step is to deposit a PEDOT:PSS hole transporting layer on a pre-cleaned ITO glass by spin-coating at 4,000 rpm. The second step is to deposit a green emissive layer by a solution-process. In the solution-process, a solution that contains 12.5 wt % bis[5-methyl-7-trifluoromethyl-5H-benzo (c)(1,5) naphthyridin-6-one]iridium(picolinate) (CF$_3$BNO) doped in 4,4'-bis (carbazol-9-yl)biphenyl (CBP) is prepared by dissolving corresponding guest and host molecules in dimethoxyethane at 80° C. with stirring. The resultant well-mixed solution was then spin-coated at 6,000 rpm under nitrogen. The resultant coated layers were subsequently heated at 70° C. for half hour to remove the residual solvent. Subsequently, a TPBi electron-transporting layer is deposited on the green emissive layer. Finally, a LiF electron injecting layer and a Al layer cathode layer in turn are deposited.

Figure 7:
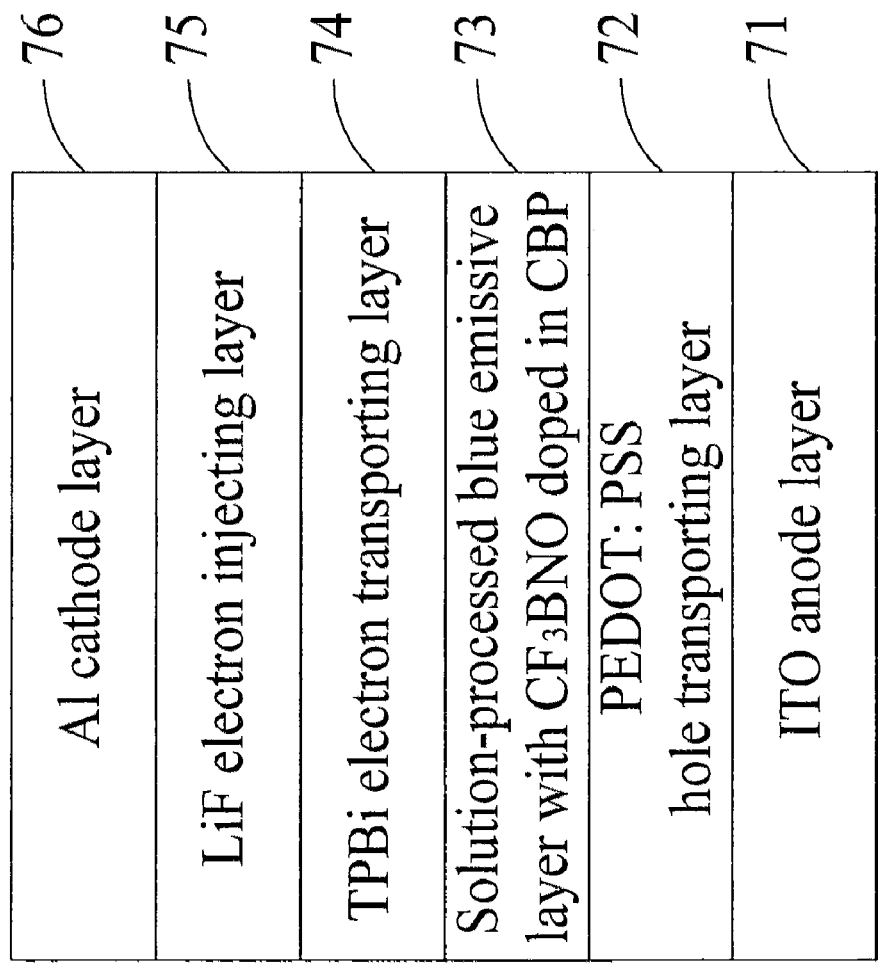
FIG. 7 illustrate a schematic diagram of a high-molecule-based OLED fabricated by the method shown in the FIG. 6 in accordance with the present invention.

Please refer to FIG. 7 for a schematic diagram of a high-molecule-based OLED fabricated by the method shown in the FIG. 6 in accordance with the present invention. The high-molecule-based OLED 7 may be consisted of a 125 nm ITO layer 71, a 35 nm PEDOT:PSS hole transporting layer 72, a 22 nm green emissive layer 73, a 32 nm TPBi electron-transporting layer 74, a 0.8 nm LiF layer 75 and a 150 nm Al layer 76.

Besides, the present invention further fabricates other various OLEDs as another embodiment example (BNO-composing OLED by a solution-process) of the present invention and comparative examples (Ir(ppy)$_3$-composing OLED by a solution-process, and CF$_3$BNO-, BNO- and Ir(Ppy)$_3$-composing OLED by a dry-process) by way of the similar method in the FIG. 6. Wherein, the BNO is the abbreviation of bis[5-methyl-5H-benzo[c][1,5]naphthyridin-6-one]iridium(picolinate) and the Ir(ppy)$_3$ is the abbreviation of tris(2-phenylpyridine)iridium (III). Characteristics and power efficiency of the CF$_3$BNO-, BNO- and Ir(ppy)$_3$-composing OLEDs are shown in Table 2. Herein, the employed host for the emissive layer is CBP. A series of doping concentrations are studied for the resultant green light-emitting CF$_3$BNO and BNO as well as for the comparing counterparts, Ir(ppy)$_3$. The respective doping concentrations for achieving the highest power efficiency were 12.5, 10.0 and 12.5 wt % for CF$_3$BNO, BNO, and Ir(ppy)$_3$. To compare the effect of the processing method, CF$_3$BNO-, BNO- and Ir(ppy)$_3$-composing devices were also fabricated via dry-process (vacuum-evaporation) at $2\times10^{-5}$ torr.

TABLE 2

| Guest | Molecular Weight (g mol$^{-1}$) | Td (° C.) | Process | Power Efficiency (lm/W) |
| --- | --- | --- | --- | --- |
| CF$_3$BNO | 869 | 290 | Solution | 70.1 |
| | | | Dry | 21.1 |
| BNO | 733 | 222 | Solution | 39.8 |
| | | | Dry | 18.5 |
| Ir(ppy)$_3$ | 655 | 395 | Solution | 18.4 |
| | | | Dry | 30.5 |

As seen in the table 2, the molecular weights are 869, 733, and 655 g mol$^{-1}$ for CF$_3$BNO, BNO, and Ir(Ppy)$_3$, respectively. Amongst, the CF$_3$BNO-composing OLED by a solution-process exhibited the highest power efficiency, which was 70.1 lm W$^{-1}$ at 100 cd m$^{-2}$ with CIE coordinates of (0.22, 0.51). In contrast, the same CF$_3$BNO-composing one by a dry-process exhibited much lower power efficiency of 21.1 lm W$^{-1}$. The reason why the dry-processed OLED had exhibited lower OLED efficiency may be attributed to the high molecular weight (869 g mol$^{-1}$) and low decomposition temperature (290° C.) characters of CF$_3$BNO, which would make it difficult to be vacuum-evaporated at elevated temperatures without decomposition. Similarly, the BNO-composing OLED exhibited a power efficiency of 39.8 lm W$^{-1}$ by the solution-process, but only 18.5 lm W$^{-1}$ via dry-process. The high molecular weight (733 g mol$^{-1}$) and low decomposition temperature (222° C.) of BNO would also make the film of BNO difficult to form via vacuum-evaporation. Contrarily, Ir(ppy)$_3$ had a comparatively lower molecular weight (655 g mol$^{-1}$) and a much higher decomposition temperature (395° C.), both of which make it much easier to be vacuum-deposited without damaging its molecular integrity. This would in turn result in a high efficiency for the Ir(ppy)$_3$-composing OLED fabricated by the dry-process, as typically observed. Indeed, the dry-processed Ir(ppy)$_3$-composing OLED exhibited efficiency of 30.5 lm W$^{-1}$, while 18.4 lm W$^{-1}$ for the solution-processed counterpart.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A method for fabricating a high-molecule-based organic light-emitting diode, the high-molecule-based organic light-emitting diode comprising an organic emissive layer, the organic emissive layer comprising a host or guest molecular material, characterized by that the method comprising a step of using the guest molecule material having a molecular weight of larger than approximately 730 g mol$^{-1}$ and depositing the organic emissive layer by way of a solution-process, wherein the guest molecular material comprises bis[5-methyl-7-trifluoromethyl-5H-benzo(c)(1,5) naphthyridin-6-one]iridium(picolinate) (CF$_3$BNO).

2. The method according to claim 1, wherein the high-molecule-based organic light-emitting diode further comprises an auxiliary layer selected from a group consisting of a first emission-auxiliary layer and a second emission-auxiliary layer, and the auxiliary layer comprises a molecular material having a molecular weight of larger than approximately 730 g mol$^{-1}$ and is formed by the solution-process.

3. The method according to claim 1, wherein the host molecular material comprises 3,5-di(9H-carbazol-9-yl) tetraphenylsilane (SimCP2).

4. The method according to claim 1, wherein the host molecular material further comprises a glass transition temperature ranging from 55-144° C., or the guest molecular material further comprises a decomposition temperature ranging from 222-395° C.

5. The method according to claim 1, wherein the solution-process comprises a spin-coating, screen-printing, inkjet-printing, contact-printing or dip-coating.

6. The method according to claim 1, wherein the organic emissive layer is sandwiched between a first emission-auxiliary layer and a second emission-auxiliary layer.

7. The method according to claim 6, wherein the first emission-auxiliary layer comprises a hole transporting layer comprising a material of poly(3,4-ethylene-dioxythiophene)-poly-(styrenesulfonate) (PEDOT:PSS).

8. The method according to claim 6, wherein the second emission-auxiliary layer comprises an electron transporting layer comprising a material of 1,3,5-tris(N-phenyl-benzimidazol-2-yl)benzene (TPBi) or an electron injecting layer comprising a material of lithium fluoride (LiF) or cesium fluoride (CsF).

* * * * *